US010630002B2

(12) United States Patent
Huang et al.

(10) Patent No.: US 10,630,002 B2
(45) Date of Patent: Apr. 21, 2020

(54) CIRCUIT BOARD AND CARD

(71) Applicants: Tyco Electronics (Shanghai) Co. Ltd., Shanghai (CN); TE Connectivity Corporation, Berwyn, PA (US)

(72) Inventors: Liang Huang, Chengdu (CN); Bruce Allen Champion, Middletown, PA (US)

(73) Assignees: Tyco Electronics (Shanghai) Co. Ltd., Shanghai (CN); TE Connectivity Corporation, Berwyn, PA (US)

( * ) Notice: Subject to any disclaimer, the term of this patent is extended or adjusted under 35 U.S.C. 154(b) by 0 days.

(21) Appl. No.: 16/233,310

(22) Filed: Dec. 27, 2018

(65) Prior Publication Data

US 2019/0207327 A1 Jul. 4, 2019

(30) Foreign Application Priority Data

Dec. 28, 2017 (CN) .......................... 2017 1 1464708

(51) Int. Cl.
| | |
|---|---|
| *H01R 4/02* | (2006.01) |
| *H01R 12/52* | (2011.01) |
| *H01R 12/70* | (2011.01) |
| *H05K 3/34* | (2006.01) |
| *H01R 13/50* | (2006.01) |
| *H01R 13/502* | (2006.01) |
| *H05K 1/11* | (2006.01) |
| *H01R 12/72* | (2011.01) |

(Continued)

(52) U.S. Cl.
CPC .............. *H01R 4/02* (2013.01); *H01R 12/52* (2013.01); *H01R 12/7082* (2013.01); *H01R 12/724* (2013.01); *H01R 13/50* (2013.01); *H01R 13/502* (2013.01); *H05K 1/11* (2013.01); *H05K 3/34* (2013.01); *H01R 12/57* (2013.01); *H01R 13/6471* (2013.01); *H01R 24/60* (2013.01); *H05K 2201/09372* (2013.01)

(58) Field of Classification Search
CPC ......... H01R 4/02; H01R 12/52; H01R 12/702
USPC ........................................................ 439/874
See application file for complete search history.

(56) References Cited

U.S. PATENT DOCUMENTS 5,197,887 A * 3/1993 Davidge .............. H01R 12/721
439/60
5,424,605 A * 6/1995 Lovoi ..................... H01J 3/022
313/422

(Continued)

*Primary Examiner* — Alexander Gilman
(74) *Attorney, Agent, or Firm* — Barley Snyder

(57) ABSTRACT

A circuit board comprises a row of solder pads adapted to be soldered to a row of contacts of a connector, a plurality of first conductive vias, and a plurality of second conductive vias. The contacts include a plurality of ground contacts and a plurality of signal contacts. The solder pads include a plurality of ground solder pads each soldered to a solder foot of one of the ground contacts and a plurality of signal solder pads each soldered to a solder foot of one of the signal contacts. The first conductive vias correspond to and are electrically connected to the ground solder pads and are electrically connected to each other by a first connection bar. The second conductive vias correspond to and are electrically connected to the ground solder pads and are electrically connected to each other by a second connection bar. The solder foot of each of the ground contacts is disposed between one of the first conductive vias and one of the second conductive vias.

17 Claims, 6 Drawing Sheets

(51) Int. Cl.
*H01R 24/60* (2011.01)
*H01R 12/57* (2011.01)
*H01R 13/6471* (2011.01)

(56) References Cited

U.S. PATENT DOCUMENTS

| | | | |
|---|---|---|---|
| 6,617,939 B1* | 9/2003 | Vermeersch | H01R 13/719 |
| | | | 333/28 R |
| 6,767,252 B2* | 7/2004 | McGrath | H05K 1/117 |
| | | | 439/637 |
| 6,994,563 B2* | 2/2006 | Amini | H05K 1/117 |
| | | | 361/777 |
| 7,663,890 B2* | 2/2010 | Nelson | H05K 3/242 |
| | | | 361/760 |
| 8,270,180 B2* | 9/2012 | Liu | H05K 1/0251 |
| | | | 174/262 |
| 8,440,917 B2* | 5/2013 | Harvey | H05K 1/0233 |
| | | | 174/262 |
| 8,614,398 B2* | 12/2013 | Regnier | H01R 13/6658 |
| | | | 174/261 |
| 8,777,673 B2* | 7/2014 | Sun | H01R 12/724 |
| | | | 439/660 |
| 9,065,225 B2* | 6/2015 | Degner | H01R 12/721 |
| 9,277,649 B2* | 3/2016 | Ellison | H01R 12/523 |
| 9,385,477 B2* | 7/2016 | De Geest | H01R 13/646 |
| 9,545,003 B2* | 1/2017 | Rengarajan | H05K 1/0222 |
| 9,871,325 B2* | 1/2018 | Patel | H01R 13/6473 |
| 10,135,211 B2* | 11/2018 | Lloyd | H05K 7/1487 |
| 10,249,988 B2* | 4/2019 | Craton | H01R 12/72 |
| 2005/0202722 A1* | 9/2005 | Regnier | H05K 1/0222 |
| | | | 439/607.05 |
| 2007/0138617 A1* | 6/2007 | Knighten | H01L 23/49827 |
| | | | 257/698 |
| 2007/0187141 A1* | 8/2007 | Bartholomew | H05K 1/029 |
| | | | 174/261 |
| 2008/0318478 A1* | 12/2008 | Nelson | H05K 1/117 |
| | | | 439/620.01 |
| 2009/0211088 A1* | 8/2009 | Bartholomew | H05K 1/0219 |
| | | | 29/846 |
| 2009/0267183 A1* | 10/2009 | Temple | H01L 21/76898 |
| | | | 257/532 |
| 2019/0207327 A1* | 7/2019 | Huang | H01R 4/02 |

\* cited by examiner

US 10,630,002 B2

CIRCUIT BOARD AND CARD

CROSS-REFERENCE TO RELATED APPLICATION

This application claims the benefit of the filing date under 35 U.S.C. § 119(a)-(d) of Chinese Patent Application No. 201711464708.2, filed on Dec. 28, 2017.

FIELD OF THE INVENTION

The present invention relates to a circuit board and a card and, more particularly, to a circuit board adapted to be soldered to a connector and a card adapted to be mated with the connector.

BACKGROUND

An input/output connector (I/O connector) generally includes an insulation body and at least one row of contacts arranged in parallel on the insulation body. Each contact includes a solder foot at a first end thereof and a contact portion at an opposite second end thereof. The solder foot of each contact is adapted to be soldered to a solder pad of a circuit board and the contact portion of each contact is adapted to be in electrical contact with a contact pad of a card inserted into the connector.

A conductive via is generally formed on each of a plurality of ground solder pads of the circuit board corresponding to a plurality of ground contacts of the row of contacts; the conductive via is located on a signal flow side of the corresponding ground solder pad away from a tail of the solder foot of the corresponding ground contact. Similarly, a conductive via is generally formed on each of a plurality of ground contact pads of the card corresponding to the ground contacts of the row of contacts; the conductive via is located on a signal flow side of the corresponding ground contact pad away from a tail of the contact portion of the corresponding ground contact. In a connector having such a structure, however, it is difficult to effectively suppress resonance of the connector.

SUMMARY

A circuit board comprises a row of solder pads adapted to be soldered to a row of contacts of a connector, a plurality of first conductive vias, and a plurality of second conductive vias. The contacts include a plurality of ground contacts and a plurality of signal contacts. The solder pads include a plurality of ground solder pads each soldered to a solder foot of one of the ground contacts and a plurality of signal solder pads each soldered to a solder foot of one of the signal contacts. The first conductive vias correspond to and are electrically connected to the ground solder pads and are electrically connected to each other by a first connection bar. The second conductive vias correspond to and are electrically connected to the ground solder pads and are electrically connected to each other by a second connection bar. The solder foot of each of the ground contacts is disposed between one of the first conductive vias and one of the second conductive vias.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
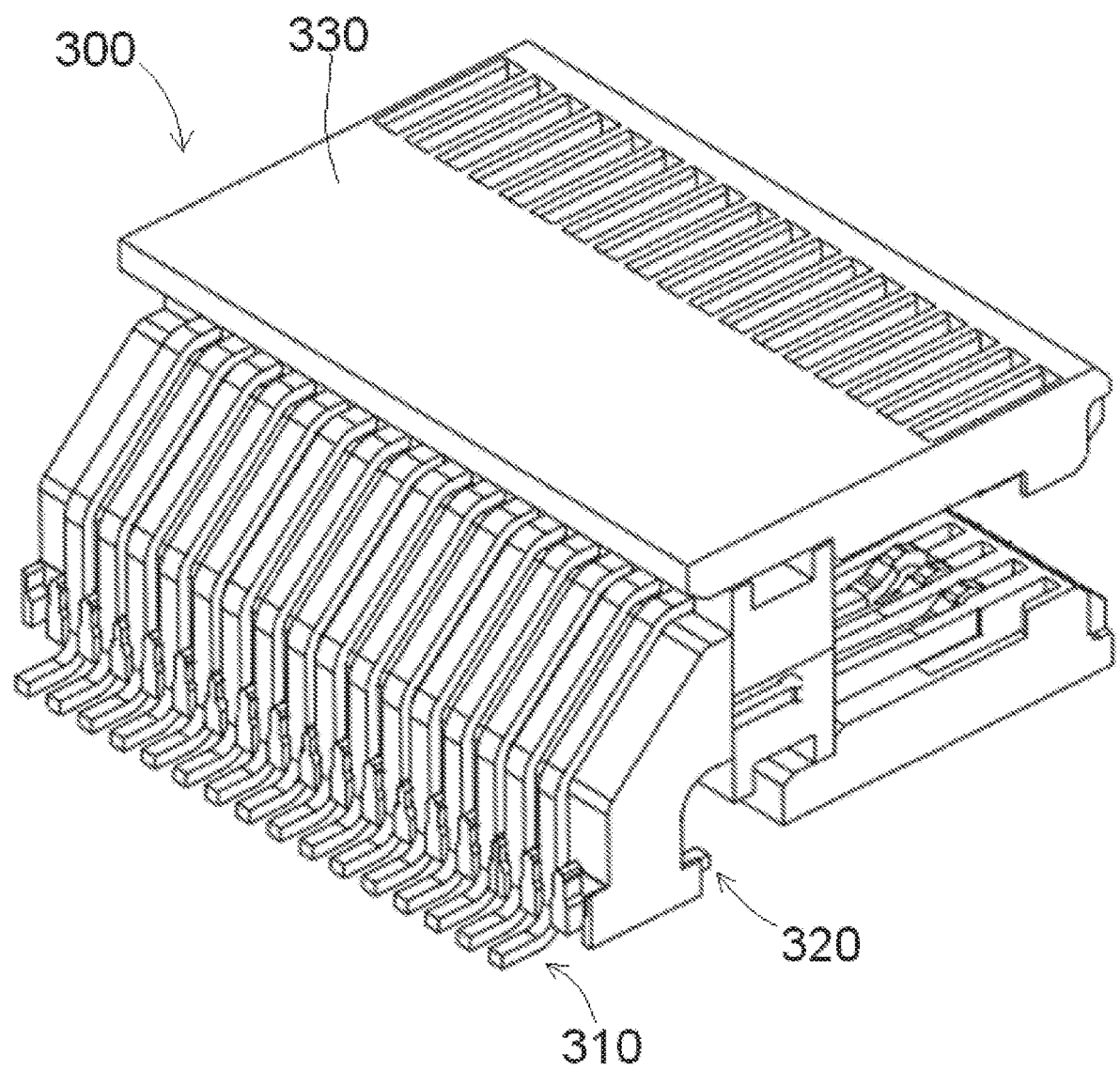
FIG. 1 is a perspective view of a connector according to an embodiment.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art.

Figure 2:
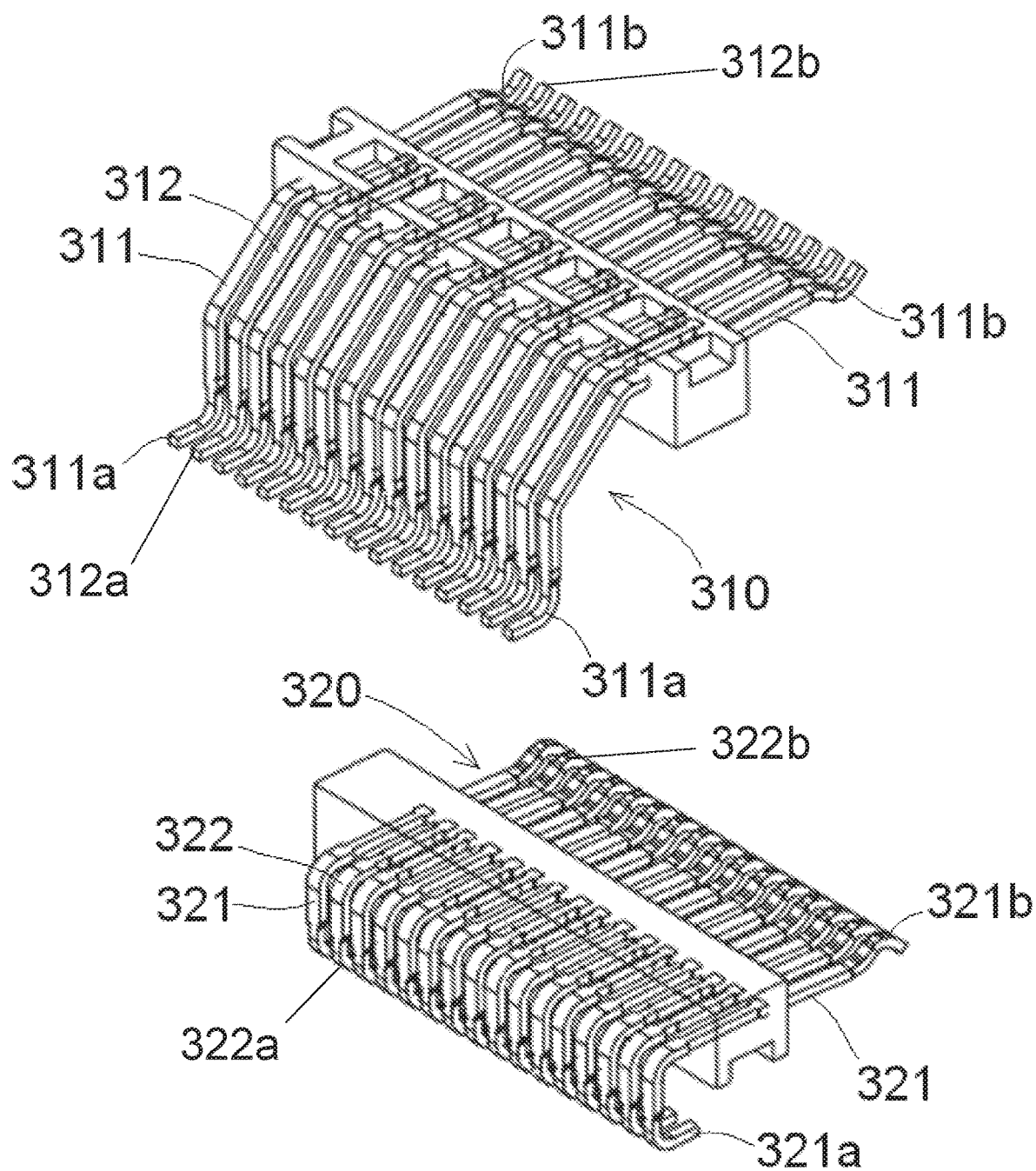
FIG. 2 is a perspective view of a row of first contacts and a row of second contacts of the connector of FIG. 1.

A connector 300 according to an embodiment is shown in FIGS. 1 and 2 and includes an insulation body 330, a row of first contacts 310, and a row of second contacts 320. The row of first contacts 310 are arranged on the insulation body 330 at a first pitch. The row of second contacts 320 are located below the row of first contacts 310 and are arranged on the insulation body 330 at a second pitch.

As shown in FIG. 2, the row of first contacts 310 includes a plurality of first ground contacts 311 and a plurality of first signal contacts 312. Each of the first ground contacts 311 has a first solder foot 311a disposed at a first end of the first ground contact 311 and a first contact portion 311b disposed at a second end of the first ground contact 311 opposite to the first end. Each of the first signal contacts 312 has a first solder foot 312a disposed at a first end of the first signal contact 312 and a first contact portion 312b disposed at a second end of the first signal contact 312 opposite to the first end. The row of second contacts 320 includes a plurality of second ground contacts 321 and a plurality of second signal contacts 322. Each of the second ground contacts 321 has a second solder foot 321a disposed at a first end of the second ground contact 321 and a second contact portion 321b disposed at a second end of the second ground contact 321 opposite to the first end. Each of the second signal contacts 322 has a second solder foot 322a disposed at a first end of the second signal contact 322 and a second contact portion 322b disposed at a second end of the second signal contact 322 opposite to the first end.

Figure 3:
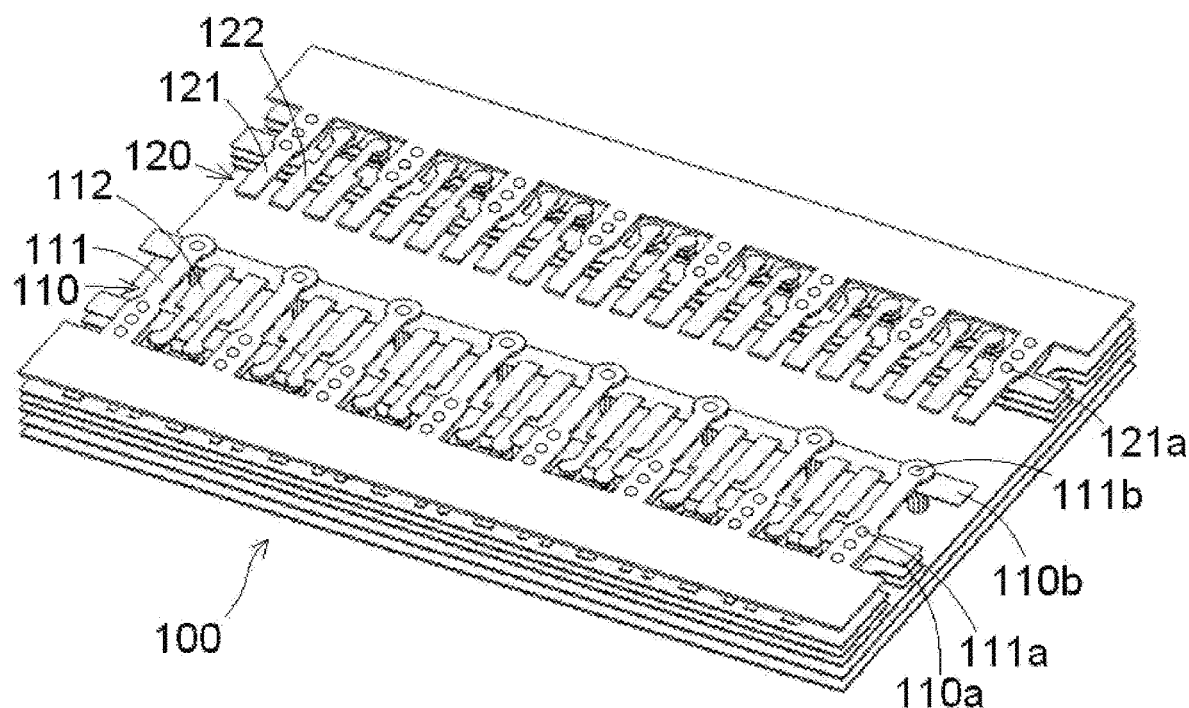
FIG. 3 is a perspective view of a circuit board adapted to be soldered to the connector of FIG. 1.
Figure 4:
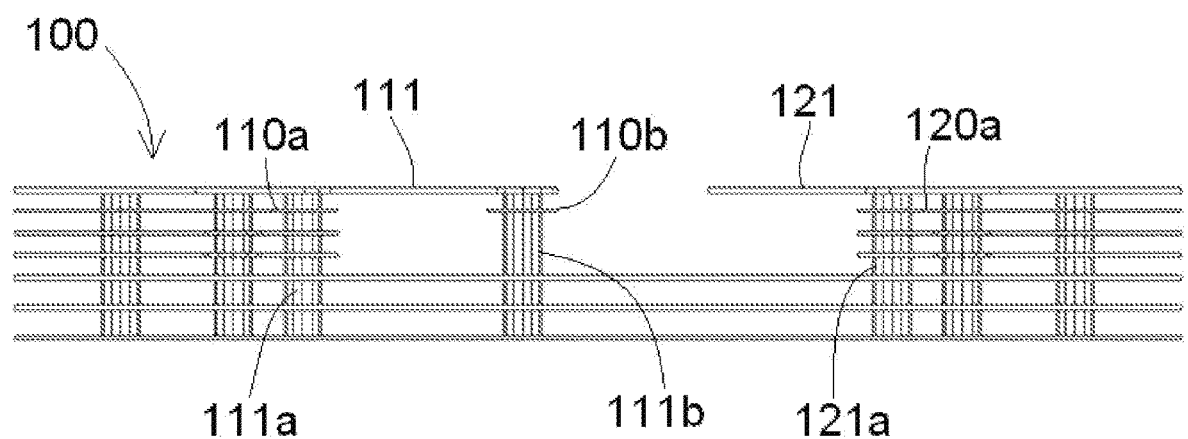
FIG. 4 is a sectional side view of the circuit board of FIG. 3.

A circuit board 100 adapted to be soldered to the connector 300 is shown in FIGS. 3 and 4. The circuit board 100 includes a row of first solder pads 110 adapted to be soldered to the row of first contacts 310 of the connector 300. The row of first solder pads 110 include a plurality of first ground solder pads 111 adapted to be soldered to the first solder feet 311a of the first ground contacts 311 and a plurality of first signal solder pads 112 adapted to be soldered to the first solder feet 312a of the first signal contacts 312. In the shown embodiment, a pair of first signal solder pads 112 are disposed between two adjacent first ground solder pads 111.

Figure 5:
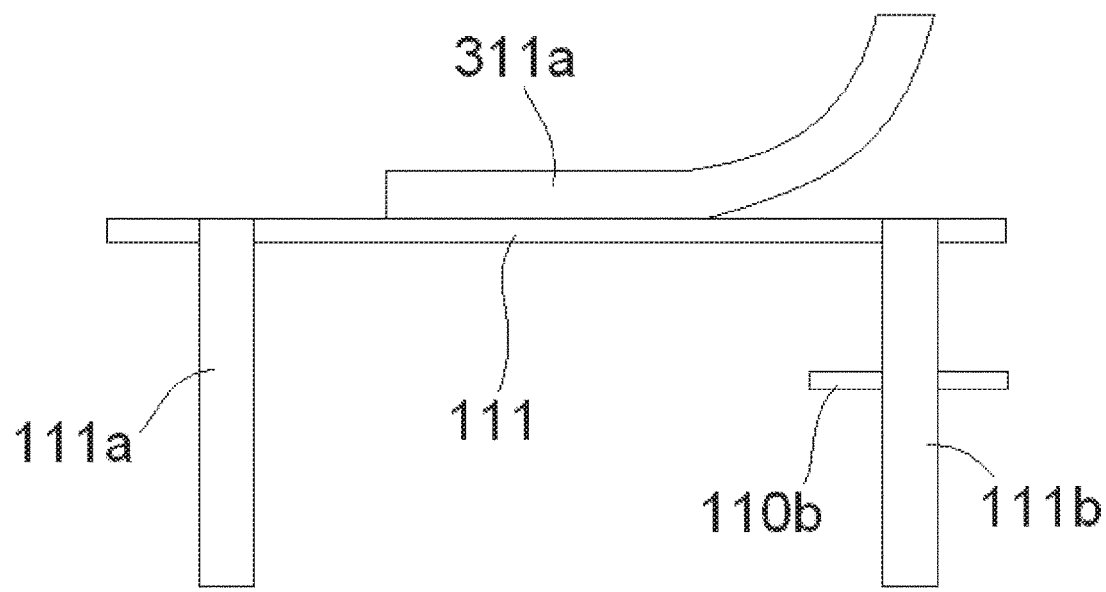
FIG. 5 is a sectional side view of a solder foot of a ground contact of the connector soldered to a ground solder pad of the circuit board.

As shown in FIGS. 3-5, a plurality of first conductive vias 111*a* corresponding to the plurality of first ground solder pads 111 and respectively electrically connected to the plurality of first ground solder pads 111 are formed on the circuit board 100. The plurality of first conductive vias 111*a* are electrically connected to each other by a first connection bar 110*a*. A plurality of second conductive vias 111*b* corresponding to the plurality of first ground solder pads 111 and respectively electrically connected to the plurality of first ground solder pads 111 are further formed on the circuit board 100. The plurality of second conductive vias 111*b* are electrically connected to each other by a second connection bar 110*b*.

As shown in FIG. 5, when the first solder foot 311*a* of each of the first ground contacts 311 is soldered to one of the first ground solder pads 111, the first solder foot 311*a* of the first ground contact 311 is located between the corresponding first conductive via 111*a* and the corresponding second conductive via 111*b*. The first conductive via 111*a* is located on a signal flow side of the first ground solder pad 111 and the second conductive via 111*b* is located on a non-signal flow side of the first ground solder pad 111. When the solder foot 311*a* of each of the first ground contacts 311 is soldered to one of the first ground solder pads 111, the first conductive via 111*a* is located on a side close to a tail of the first solder foot 311*a*, and the second conductive via 111*b* is located on the other side away from the tail of the first solder foot 311*a*.

The circuit board 100, as shown in FIGS. 3 and 4, has a multi-layer structure in which the row of first solder pads 110 is located on a top or bottom layer of the circuit board 100 and the second connection bar 110*b* is located in any layer between the top and bottom layers of the circuit board 100. In this way, the coupling between the signal contacts 312 and the ground contacts 311 may be adjusted by adjusting a distance between the second connection bar 110*b* and the top layer of the circuit board 100, suppressing the resonance of the connector 300.

The circuit board 100, as shown in FIGS. 3 and 4, includes a row of second solder pads 120 adapted to be soldered to the row of second contacts 320 of the connector 300. The row of second solder pads 120 includes a plurality of second ground solder pads 121 adapted to be soldered to the second solder feet 321*a* of the second ground contacts 321 and a plurality of second signal solder pads 122 adapted to be soldered to the second solder feet 322*a* of the second signal contacts 322. A plurality of third conductive vias 121*a* corresponding to the plurality of second ground solder pads 121 and electrically connected to the second ground solder pads 121 are formed on the circuit board 100. The third conductive vias 121*a* are electrically connected to each other by a third connection bar 120*a*.

Figure 6:
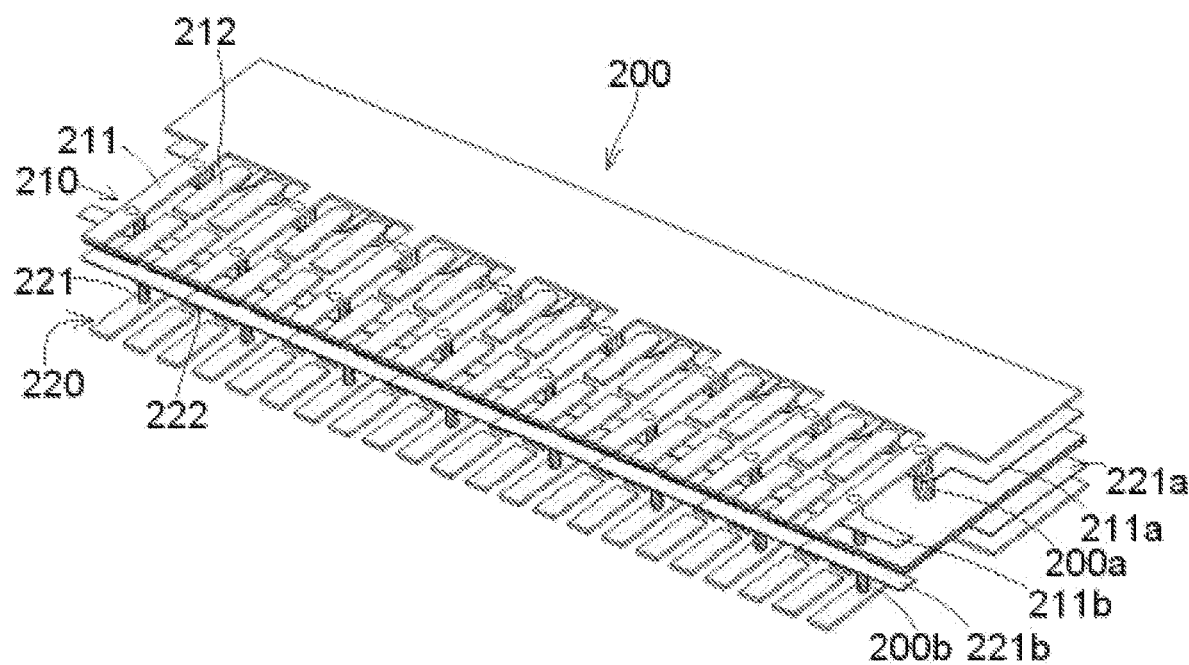
FIG. 6 is a perspective view of a card adapted to be mated with the connector of FIG. 1.
Figure 7:
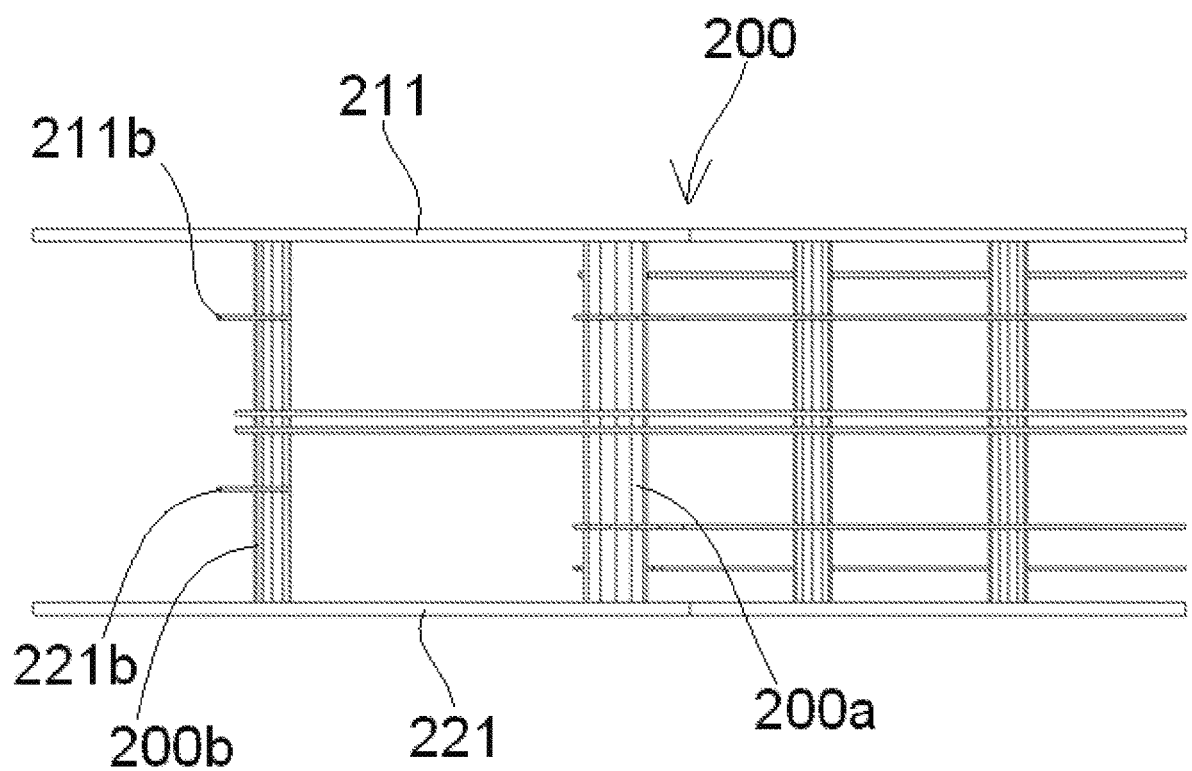
FIG. 7 is a sectional side view of the card of FIG. 6.

A card 200 adapted to be mated with the connector 300 is shown in FIGS. 6 and 7. The card 200 includes a row of first contact pads 210 adapted to be in electrical contact with the row of first contacts 310 of the connector 300 and located on a top layer of the card 200. The row of first contact pads 210 include a plurality of first ground contact pads 211 adapted to be in electrical contact with the first contact portions 311*b* of the first ground contacts 311 and a plurality of first signal contact pads 212 adapted to be in electrical contact with the first contact portions 312*b* of the first signal contacts 312.

As shown in FIGS. 6 and 7, a plurality of first conductive vias 200*a* corresponding to the plurality of first ground contact pads 211 and electrically connected to the first ground contact pads 211 are formed on the card 200, and the plurality of first conductive vias 200*a* are electrically connected to each other by a first connection bar 211*a*. A plurality of second conductive vias 200*b* corresponding to the plurality of first ground contact pads 211 and electrically connected to the first ground contact pads 211 are further formed on the card 200, and the plurality of second conductive vias 200*b* are electrically connected to each other by a second connection bar 221*b*. In the shown embodiment, a pair of first signal contact pads 212 are disposed between two adjacent first ground contact pads 211.

Figure 8:
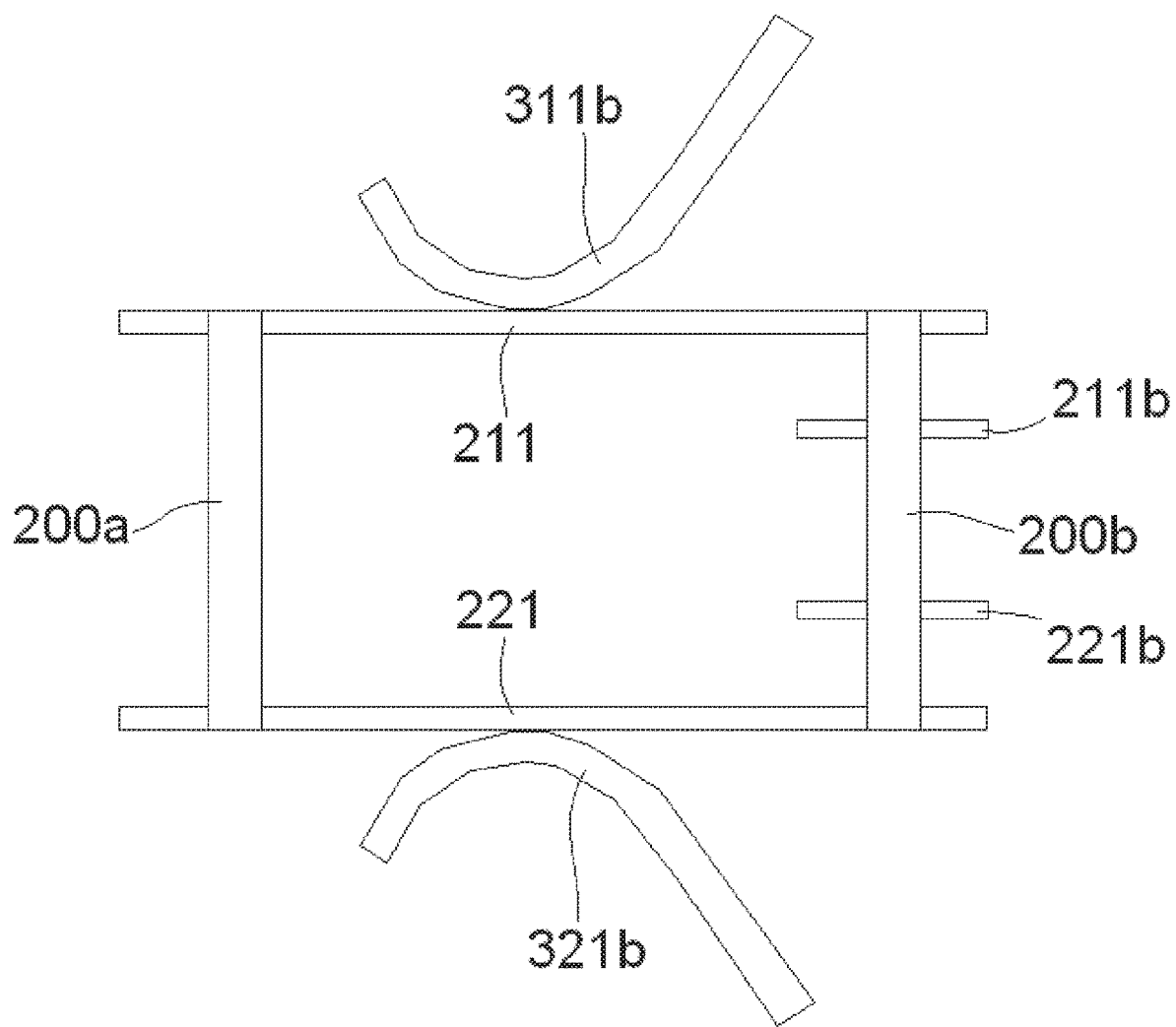
FIG. 8 is a sectional side view of contact portions of the ground contacts of the connector in electrical contact with a plurality of ground contact pads of the card.

As shown in FIG. 8, when the first contact portion 311*b* of each of the first ground contacts 311 is in electrical contact with one of the first ground contact pads 211, the first contact portion 311*b* of the first ground contact 311 is located between the corresponding first conductive via 200*a* and the corresponding second conductive via 200*b*. The first conductive via 200*a* is located on the signal flow side of the first ground solder pad 211 and the second conductive via 200*b* is located on the non-signal flow side of the first ground solder pad 211. When the first contact portion 311*b* of each of the first ground contacts 311 is in electrical contact with the corresponding first ground contact pad 211, the first conductive via 200*a* is located on a side close to a tail of the first contact portion 311*b* and the second conductive via 200*b* is located on the other side away from the tail of the first contact portion 311*b*.

The card 200, as shown in FIGS. 6 and 7, includes a row of second contact pads 220 adapted to be in electrical contact with the row of second contacts 320 of the connector 300 and located on a bottom layer of the card 200. The row of second contact pads 220 includes a plurality of second ground contact pads 221 adapted to be to be in electrical contact with the second contact portions 321*b* of the second ground contacts 321 and a plurality of second signal contact pads 222 adapted to be in electrical contact with the second contact portions 322*b* of the second signal contacts 322. In the embodiment shown in FIG. 6, a pair of second signal contact pads 222 are disposed between two adjacent second ground contact pads 221.

As shown in FIGS. 6-8, the first conductive vias 200*a* are electrically connected to the plurality of second ground contact pads 221 and the plurality of second conductive vias 200*b* are electrically connected to the plurality of second ground contact pads 221. As shown in FIG. 8, when the second contact portion 321*b* of each of the second ground contacts 321 is in electrical contact with the corresponding second ground contact pad 221, the second contact portion 321*b* of the second ground contact 321 is located between the corresponding first conductive via 200*a* and the corresponding second conductive via 200*b*. The first conductive via 200*a* is located on the signal flow side of the second ground solder pad 221 and the second conductive via 200*b* is located on the non-signal flow side of the second ground solder pad 221. When the second contact portion 321*b* of each of the second ground contacts 321 is in electrical contact with the corresponding second ground contact pad 221, the first conductive via 200*a* is located on a side close to a tail of the second contact portion 321*b* and the second conductive via 200*b* is located on the other side away from the tail of the second contact portion 321*b*.

The card 200 further includes a third connection bar 221*a*, shown in FIG. 6, located below the first connection bar 211*a*. The plurality of first conductive vias 200*a* are electrically connected to each other by the third connection bar 221*a*. The card 200 further includes a fourth connection bar 221*b*, shown in FIGS. 6-8, located below the second connection bar 211b. The plurality of the second conductive vias 200b are electrically connected to each other by the fourth connection bar 221b.

As shown in FIGS. 6-8, the card 200 is of a multi-layer structure in which the second connection bar 211b may be located in any layer between the top layer of the card 200 and the fourth connection bar 221b, and the fourth connection bar 221b may be located in any layer between the bottom layer of the card 200 and the second connection bar 211b. The coupling between the first signal contacts 312 and the first ground contacts 311 may be adjusted by adjusting a distance between the second connection bar 211b and the top layer of the card 200, suppressing the resonance of the connector 300. Similarly, the coupling between the second signal contacts 322 and the second ground contacts 321 may be adjusted by adjusting a distance between the fourth connection bar 221b and the bottom layer of the card 200, suppressing the resonance of the connector 300. In various embodiments, the distance between the second connection bar 211b and the top layer of the card 200 may be equal to or not equal to the distance between the fourth connection bar 221b and the bottom layer of the card 200.

What is claimed is:

1. A circuit board, comprising:
a row of first solder pads adapted to be soldered to a row of first contacts of a connector, the row of first contacts includes a plurality of first ground contacts and a plurality of first signal contacts, the row of first solder pads includes a plurality of first ground solder pads each soldered to a first solder foot of one of the first ground contacts and a plurality of first signal solder pads each soldered to a first solder foot of one of the first signal contacts;
a plurality of first conductive vias corresponding to the plurality of first ground solder pads and electrically connected to the plurality of first ground solder pads, the plurality of first conductive vias are electrically connected to each other by a first connection bar; and
a plurality of second conductive vias corresponding to the plurality of first ground solder pads and electrically connected to the plurality of first ground solder pads, the plurality of second conductive vias are electrically connected to each other by a second connection bar, the first solder foot of each of the first ground contacts is disposed between one of the first conductive vias and one of the second conductive vias when the first solder foot is soldered to one of the first ground solder pads, the circuit board has a plurality of layers, the row of first solder pads is located on a top layer or a bottom layer of the circuit board, the first connection bar and the second connection bar are located in a same layer between the top layer and the bottom layer, the second connection bar is spaced apart from the first connection bar in the same layer.

2. The circuit board of claim 1, wherein the one of the first conductive vias is located on a side close to a tail of the first solder foot of the first ground contact and the one of the second conductive vias is located on an opposite side from the tail of the first solder foot of the first ground contact.

3. The circuit board of claim 1, wherein a pair of first signal solder pads are disposed between two adjacent first ground solder pads.

4. The circuit board of claim 1, further comprising a row of second solder pads adapted to be soldered to a row of second contacts of the connector, the row of second contacts includes a plurality of second ground contacts and a plurality of second signal contacts, the row of second solder pads includes a plurality of second ground solder pads each soldered to a second solder foot of one of the second ground contacts and a plurality of second signal solder pads each soldered to a second solder foot of one of the second signal contacts.

5. The circuit board of claim 4, further comprising a plurality of third conductive vias corresponding to the plurality of second ground solder pads and electrically connected to the plurality of second ground solder pads, the plurality of third conductive vias are electrically connected to each other by a third connection bar.

6. A card, comprising:
a row of first contact pads disposed on a top layer of the card and adapted to electrically contact a row of first contacts of a connector, the row of first contacts includes a plurality of first ground contacts and a plurality of first signal contacts, the row of first contact pads includes a plurality of first ground contact pads each adapted to electrically contact a first contact portion of one of the first ground contacts and a plurality of first signal contact pads each adapted to electrically contact a first contact portion of one of the first signal contacts;
a plurality of first conductive vias corresponding to the plurality of first ground contact pads and electrically connected to the plurality of first ground contact pads, the plurality of first conductive vias are electrically connected to each other by a first connection bar; and
a plurality of second conductive vias corresponding to the plurality of first ground contact pads and electrically connected to the plurality of first ground contact pads, the plurality of second conductive vias are electrically connected to each other by a second connection bar, the first contact portion of each of the first ground contacts is disposed between one of the first conductive vias and one of the second conductive vias when the first contact portion is in electrical contact with one of the first ground contact pads, the card has a plurality of layers and the first connection bar and the second connection bar are located in a same layer below the top layer of the card, the second connection bar is spaced apart from the first connection bar in the same layer.

7. The card of claim 6, wherein the one of the first conductive vias is located on a side close to a tail of the first contact portion of the first ground contact and the one of the second conductive vias is located on an opposite side from the tail of the first contact portion of the first ground contact.

8. The card of claim 6, wherein a pair of first signal contact pads are disposed between two adjacent first ground contact pads.

9. The card of claim 8, further comprising a row of second contact pads disposed on a bottom layer of the card and adapted to electrically contact a row of second contacts of the connector, the row of second contacts includes a plurality of second ground contacts and a plurality of second signal contacts, the row of second contact pads includes a plurality of second ground contact pads each adapted to electrically contact a second contact portion of one of the second ground contacts and a plurality of second signal contact pads each adapted to electrically contact a second contact portion of one of the second signal contacts.

10. The card of claim 9, wherein the plurality of first conductive vias are electrically connected to the plurality of second ground contact pads and the plurality of second conductive vias are electrically connected to the plurality of second ground contact pads.

11. The card of claim 10, wherein the second contact portion of each of the second ground contacts is disposed between one of the first conductive vias and one of the second conductive vias when the second contact portion is in electrical contact with one of the second ground contact pads.

12. The card of claim 11, wherein the one of the first conductive vias is located on a side close to a tail of the second contact portion of the second ground contact and the one of the second conductive vias is located on an opposite side from the tail of the second contact portion of the second ground contact.

13. The card of claim 9, wherein a pair of second signal contact pads are disposed between two adjacent second ground contact pads.

14. The card of claim 9, further comprising a third connection bar disposed below the first connection bar, the plurality of first conductive vias are electrically connected to each other by the third connection bar.

15. The card of claim 14, further comprising a fourth connection bar disposed below the second connection bar, the plurality of second conductive vias are electrically connected to each other by the fourth connection bar.

16. The card of claim 15, wherein the second connection bar is located between the top layer of the card and the fourth connection bar.

17. The card of claim 16, wherein the fourth connection bar is located in any layer between the bottom layer of the card and the second connection bar.

\* \* \* \* \*